(12) United States Patent
Zhao et al.

(10) Patent No.: US 7,282,261 B2
(45) Date of Patent: Oct. 16, 2007

(54) METHOD OF ENHANCING THE STABILITY OF ELECTROACTIVE POLYMERS AND REDOX ACTIVE MATERIALS

(75) Inventors: Luping Zhao, Singapore (SG); Koon Gee Neoh, Singapore (SG); En-Tang Kang, Singapore (SG)

(73) Assignee: National University of Singapore, Singapore (SG)

( * ) Notice: Subject to any disclaimer, the term of this patent is extended or adjusted under 35 U.S.C. 154(b) by 212 days.

(21) Appl. No.: 10/367,180

(22) Filed: Feb. 13, 2003

(65) Prior Publication Data

US 2004/0161613 A1    Aug. 19, 2004

(51) Int. Cl.
B32B 27/06 (2006.01)
B32B 27/16 (2006.01)
C23C 14/12 (2006.01)
C23C 14/34 (2006.01)

(52) U.S. Cl. ............... 428/336; 428/421; 428/422; 204/192.15

(58) Field of Classification Search ............... 428/336, 428/339, 421, 422; 204/192.12, 192.15, 204/192.16, 192.17; 252/500
See application file for complete search history.

(56) References Cited

U.S. PATENT DOCUMENTS

| | | | |
|---|---|---|---|
| 4,060,471 A | 11/1977 | Pinch et al. | |
| 4,692,225 A | 9/1987 | Witucki et al. | 442/115 |
| 4,971,673 A | 11/1990 | Weisweiler et al. | |
| 5,059,327 A * | 10/1991 | Takegami | 210/500.34 |
| 5,198,266 A | 3/1993 | Witucki et al. | 427/126.2 |
| 5,393,610 A | 2/1995 | Witucki et al. | 428/447 |
| 5,516,462 A | 5/1996 | Miles et al. | 252/583 |
| 7,087,348 B2 * | 8/2006 | Holman et al. | 429/209 |
| 2001/0037681 A1* | 11/2001 | Shibue et al. | 73/335.02 |

FOREIGN PATENT DOCUMENTS

| | | |
|---|---|---|
| EP | 0682284 | 8/1995 |
| EP | 0783050 | 6/1996 |
| GB | 1332791 | 10/1973 |
| JP | 2221851 | 9/1990 |
| JP | 09001717 A * | 1/1997 |
| JP | 2000323280 A * | 11/2000 |

OTHER PUBLICATIONS

Derwent Abstract of JP 2000-323280 A, Nov. 2000.*
JPO Abstract of JP 2000-323280 A, Nov. 2000.*
Machine assisted translation of JP 2000-323280 A, Nov. 2000.*
Derwent abstract of JP 09-001717 A, Jan. 1997.*
English language translation of JP 09-001717 A, Jan. 1997.*
Zhao, Baozong, et al., "Enhancement of Electrical Stability of Polyanaline Films in Aqueous Media by Surface Graft Copolymerization with Hydrophobic Monomers", Langmuir (1999), 15, 8259-8264.
Xin, Liu, et al., "Surface Functionalization of Glass and Polymeric Substrates via Graft Copolymerization of Viologen in an Aqueous Medium", Langmuir 2002, 18, 2914-2921.
Macdiarmid, A.G., et al, "Polyaniline: A New Concept in Conducting Polymers", Synthetic Metals, 18 (1987) 285-290.
Ito, Shoji, et al., "Short Communication Simple synthesis of water-soluble conducting polyaniline", Synthetic Metals 96 (1998) 161-163.
NG, S.W., et al., "Conversion of Polyaniline from Insulating to Conducting State in Aqueous Viologen Solutions", J. Phys. Chem. B 2001, 105, 5618-5625.
Kang, E.T., et al., Polymer Reports: "Self-doped polyaniline and polypyrrole. A comparative study by X-ray photoelectron spectroscopy", Polymer Communications, 1991, vol. 32, No. 13.
Zhao, Luping, et al., "Photoinduced and Thermal-Activated Doping of Polyaniline", Chem. Mater. 2002, 14, 1098-1106.
Neoh, K.G., et al, "Limitations of the X-ray Photoelectron Spectroscopy Technique in the Study of Electroactive Polymers", J. Phys. Chem. B 1997, 101, 726-731.
Neoh, K.G., et al,"Degradation behavior of polyanilines with different modes of doping", Polymer Degradation and Stability 43 (1994) 141-147.
Vermeulen, Lori A., et al., "Letters to Nature: Stable photoinduced charge separation in layered viologen compounds", Nature. vol. 358. Aug. 20, 1992.
Yue, Jiang, et al., "Effect of Sulfonic Acid Group on Polyaniline Backbone", J. Am. Chem. Soc. 1991, 113, 2665-2671.
Chen, Show-An, et al., "Structure and Properties of Poly(acrylic acid)-Doped Polyaniline", Macromolecules 1995, 28, 2858-2866.

* cited by examiner

Primary Examiner—Ramsey Zacharia
(74) Attorney, Agent, or Firm—Klarquist Sparkman, LLP

(57) ABSTRACT

This invention relates to a method of enhancing the stability of electroactive polymers, redox active materials, or a composite comprising an electroactive polymer and a redox active material, which comprises depositing on the electroactive polymers, the redox active materials, or the composite, a fluoropolymer by radio frequency sputtering. The invention also relates to electroactive polymers, redox active materials, or a composite comprising an electroactive polymer and a redox active material, that bears a radio frequency sputtered fluoropolymer coating.

21 Claims, 3 Drawing Sheets

METHOD OF ENHANCING THE STABILITY OF ELECTROACTIVE POLYMERS AND REDOX ACTIVE MATERIALS

FIELD OF THE INVENTION

This invention relates to a method of enhancing the stability of electroactive polymers and redox active materials by deposition of a fluoropolymer coating by radio frequency sputtering.

DESCRIPTION OF THE RELATED ART

Stability Enhancement of Electroactive Polymers

Electroactive polymers have undergone an unexpectedly rapid development in the last half-century. Polyaniline (PANI) is an extensively studied electroactive polymer due to its interesting properties and potential applications. PANI doped with mobile inorganic anions readily undergoes undoping when immersed in water, and in basic solutions the undoping process is particularly rapid. This limits the scope of possible applications for these electroactive materials. Some investigations have therefore been devoted to improve the electrical stability of PANI in aqueous media through either physical or chemical methods.

(1) Modification of PANI Films or Fibers.

Surface graft copolymerization of PANI with a hydrophobic monomer is a practical way to retard deprotonation, and the associated loss of conductivity. Hydrophobic monomers such as pentafluorostyrene (PFS) and styrene can be graft copolymerized, in a multi-step method, on the surface of PANI film. The grafted film exhibits significantly higher stability in maintaining its conductive state than the unqrafted film, either in deionized water or in aqueous media with pH from 2 to 10. The protective effect is diminished when the pH exceeds 10. (Zhao Baozong, Neoh K. G., Liu F. T., Kang E. T., *Langmuir*, 15, 8259 (1999))

U.S. Pat. No. 4,692,225 discloses a method of stabilizing electroactive polymers to hostile environments. The electroactive polymer may be, for example, polypyrrole or polyaniline, as a powder, a free-standing film or preferably in the form of a composite with a substrate, such as a fiberglass fabric, impregnated with the electroactive polymer. The method comprises encapsulating the electroactive polymer with a suitable epoxy, polyimide or bis-maleimide resin, as an encapsulating agent. The preferred method involves "coating or pre-pregging" the fabric of the electroactive polymer with an epoxy resin and curing the resulting system.

U.S. Pat. No. 5,393,610 and U.S. Pat. No. 5,198,266 disclose a method for stabilizing the shelf life conductivity of conductive coating such as polypyrrole or nickel sulfide on a substrate such as fiberglass by incorporating a polyphenol or a polysiloxane in the conductive coating. The polyphenol is derived from a phenolic material in the form of a phenol-formaldehyde monomer or an oligomer of phenol-formaldehyde, and the polysiloxane is derived from a siloxane. Upon heating, the phenolic material cures to a polyphenol and the siloxane is converted to a polysiloxane, forming the stabilizing material on the conductive polypyrrole or nickel sulfide coated substrate. The phenolic material is preferably incorporated directly into the solution formulation for preparing the conductive nickel sulfide or polypyrrole on the substrate, and the polyphenol stabilizer is formed together with the conductive coating on the substrate by heating. In the case of the silane or siloxane material, the conductive polypyrrole or nickel sulfide preferably is formed first on the substrate, and the conductive coated substrate is contacted with a solution of the siloxane followed by heating to convert the siloxane to a polysiloxane protective overcoating.

Japan Patent JP 2221851 discloses a method of improving the electrochemical properties of conducting polymer chemical sensor by coating the polymer with a hydrophobic polymer via spin coating or by the use of adhesives.

European Patent EP 0783050 describes the stability enhancement of electroactive polymers. A method of depositing a electroactive polymer film on a textile fabric substrate is provided by the oxidative polymerization of a pyrrole compound in the presence of a dopant anion and a stabilizing agent having the formula:

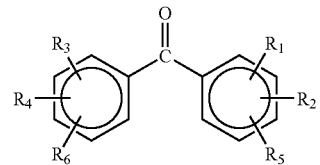

wherein R1, R2, R3 and R4 are independently selected from H, OH, and OR, and R is C1-C8 alkyl; and R5 and R6 are independently selected from H, COOH and $SO_3H$.

These methods achieve the stability enhancement of electroactive polymers by either surface or bulk modification. However, in the surface modification techniques mentioned above, the surface conductivity of a film of the electroactive polymer will decrease after the coating or grafting process, and the thickness of the coating or graft layer is difficult to control. On the other hand, the bulk modification of the electroactive polymers to form a composite will change the nature of the electroactive polymer, resulting in a lower conductivity. Hence these methods are useful only for special products and for certain applications.

(2) Using Organic or Polymeric Anions as Dopants

An alternative way of retarding the deprotonation of the conducting polymer is to minimize the loss of counterions from the electroactive polymer. Loss of counterions is accompanied by deprotonation of the electroactive polymer, which then reverts to a non-conductive state. PANI salt films cast from salt solutions retain anions better when treated with water if larger organic anions (e.g. sulfosalicylic acid) rather than smaller inorganic acid anions (e.g. $Cl^-$, $ClO_4^-$) are used. (Neoh K. G.; Kang E. T.; Tan K. L. *Polym. Degrad. Stabil.* 43, 141 (1994)) Polymeric anions incorporated into the electroactive polymer matrix are not easily lost when the polymer is immersed in water. However, these methods cause some problems. Films doped with large organic or polymeric anions have substantially weaker mechanical properties than films doped with inorganic acid anions, as well as lower doping levels and conductivity. Doped PANI films prepared by blending PANI with poly(acrylic acid) in N-methyl-2-pyrrolidinone (NMP) have the problem of non-uniformity and inefficient doping (Chen, S. A.; Lee, H. T. *Macromolecules,* 28, 2858(1995)), and the synthesis of PANI in polymeric acids leads largely to soluble product (Neoh K. G.; Kang E. T.; Tan K. L. *J. Phys. Chem. B.* 101, 726(1997)).

(3) Self-Doped Polymers

In these polymers, functional acid groups such as —$SO_3H$ covalently attached on the polymer chains of the electroactive polymer serve as counterions in the polymer matrix. These counterion groups can be introduced by treatment of PANI or polypyrrole (PPY) with fuming sulfuric acid (Yue J.; Wang Z. H.; Cromack, K. R.; Epstein A. J.; MacDiarmid, A. G. *J. Am. Chem. Soc.* 113, 2665(1991); Kang E. T.; Neoh K. G.; Woo Y. L.; Tan K. L. *Polym. Commun.* 32, 412 (1991)) or with chlorosulfonic acid (Murata K.; Teshima S.; Aizawa R.; Asako Y.; Takahashi K.; Hoffman B. M. *Synth. Met.* 96, 161 (1998)) The substituting groups diminish the conjugation of polymer units, resulting in the self-doped polymer being less conductive (about one or more order of magnitude in loss of conductivity) than the externally doped polymer. The self-doped polymers usually are of poor mechanical strength. It has been verified that the immobilized —$SO_3^-$ groups in the self-doped polymer are stable in water.

It should be noted that the undoping process would be accelerated in basic solutions. Electroactive polymers modified by using organic or polymeric anions as dopants or self-doped polymers as mentioned above rapidly revert to the insulating state especially in basic solution with high pH value.

Stability Enhancement of Redox Active Materials

An example of redox active materials includes 1,1'-disubstituted-4,4'-bipyridinium salts, which are commonly known as viologens. Viologens exist in three redox states, as dication, radical cation, and di-reduced species. Almost all of the applications of viologens are related to electron transfer reaction between the first two redox states. Viologens display a photochromic effect caused by reduction of the viologen dication to its radical cation and this has received considerable attention for application to electrochromic displays, dosimeters and actinometers. However, the radical cations of viologens are not stable in air because of the highly oxidation-sensitive nature of the radical cation. Reaction with molecular oxygen is particularly fast. In order to shield viologens from oxygen or other oxidizing agents, different methods have been attempted to maintain the stability of the radical cations.

(1) Vermeulen [L. A., Thompson M. E. *NATURE*, 358, 656 (1992)] describes stable photo-induced charge separation in layered viologen compounds. It is reported that the photochromic behavior of novel layered zirconium phosphonate/viologen compounds shows very efficient photo-induced charge transfer. The compounds form a charge-separated state that is long-lived and stable in air. Spectroscopic studies indicate that the photoproduct is a dialkyl viologen radical cation, produced in the interlamellar region of the zirconium phosphonate. It is suggested that the remarkable stability of the charge-separated state arises from structural features that allow for stabilization of the radicals by delocalization and shielding from molecular oxygen.

(2) U.S. Pat. No. 5,516,462 describes an enhanced cycle lifetime electrochromic system. In this electrochromic systems, the increase in cycle lifetime is a product of one or more of the following: novel or known asymmetric viologen compounds, mixed electrolyte systems, and mixed solvent systems.

(3) European Patent EP 0682284 describes an electrochromic device having excellent coloring properties which uses an electrolyte solution composed of a viologen and a specific alcohol solvent as one component of the device, or uses an electrolyte film produced by immersing or immobilizing the solution into a porous film as one component of the device. It further provides an electrochromic device having improved operation life and stability to operate at a lower temperature and comprising an electrolyte placed between a pair of electrodes, wherein the electrolyte is in the form of an electrolyte solution prepared by dissolving a viologen derivative in an organic solvent or wherein the electrolyte is in the form of an electrolyte film prepared by immersing and immobilizing the solution into a porous film.

In both U.S. Pat. No. 5,516,462 and EP patent 0682284 viologens are employed as the electrolyte in electrochromic devices. In order to avoid oxidation, the redox active viologen is usually tightly sandwiched between two electrodes and/or support substrates like glass.

BRIEF SUMMARY OF THE INVENTION

Surprisingly, a different approach has been found for stabilizing the desired conductive properties or oxidation states of electroactive polymers or redox active materials. In this process, electroactive polymers or redox active materials are coated with a fluoropolymer, using radio frequency (RF) sputtering.

In one aspect, the invention provides a method of enhancing the stability of an electroactive polymer, a redox active material, or a composite comprising an electroactive polymer and a redox active material, which comprises depositing on the electroactive polymer, the redox active material, or the composite, a fluoropolymer coating by radio frequency sputtering.

In another aspect, the invention provides an electroactive polymer, a redox active material, or a composite comprising an electroactive polymer and a redox active material, that bears a radio frequency sputtered fluoropolymer coating.

The present method employs a thin, fluoropolymer coating deposited on the electroactive polymer or redox active material via RF sputtering. The fluoropolymer coating can be transparent. No adhesives or epoxy resin are needed to apply the fluoropolymer coating, and no solvent is required in the coating process, and the surfaces of the electroactive polymer or redox active material to be coated do not require pre-treatment. The use of RF sputtering in the present invention leads to a thickness of fluoropolymer coating that can be controlled by changing the sputtering time at fixed power levels, or by carrying out the sputtering for a certain time at different radio frequency powers. The thickness of the fluoropolymer may be, for example, from about 10 nm to about 100 nm (e.g. about 10, 20, 30, 40, 50, 60, 70, 80, 90 or 100 nm).

The present invention does not result in significant changes to the bulk properties of the electroactive polymer or redox active material. The coating process can be carried out after the electroactive polymer or redox active materials have attained the desired level of activity. Alternatively, further photoinduced reactions can be carried out in the electroactive polymers or redox active materials after the coating process, in the embodiments where the fluoropolymer coating has a thin and transparent nature.

The present invention relates to a method of enhancing the stability of electroactive polymers and redox active materials. In the case of electroactive polymers, for example polyaniline, the fluoropolymer coating enhances the electrical stability of the polymer, especially when it is immersed in aqueous media. In the case of redox active materials, for example viologens, the fluoropolymer coating enhances the oxidation resistance (also referred to as photochromic stability) of the viologen. The preferred method of enhancing the stability of the electroactive polymer or redox active material involves the deposition of a layer of a fluoropolymer, for example fluorinated ethylene propylene copolymer (FEP), having a thickness of about 10 nm or more on the surface of the electroactive material. When a polyaniline film sputtered with fluoropolymer is immersed in aqueous media such as water, or in a basic solution, degradation of the electrical conductivity of the film is retarded. Similarly, when a viologen film sputtered with fluoropolymer is excited under UV irradiation to the radical cation state, a resulting coloration of the film is maintained for a longer period of time due to retardation of the reaction of the viologen film with an oxidative atmosphere, such as an atmosphere containing oxygen.

The stability enhancement of both the electroactive polymer and the redox active material is evident from conductivity measurement and/or spectroscopic analysis.

DESCRIPTION OF THE PREFERRED EMBODIMENTS

Figure 1:
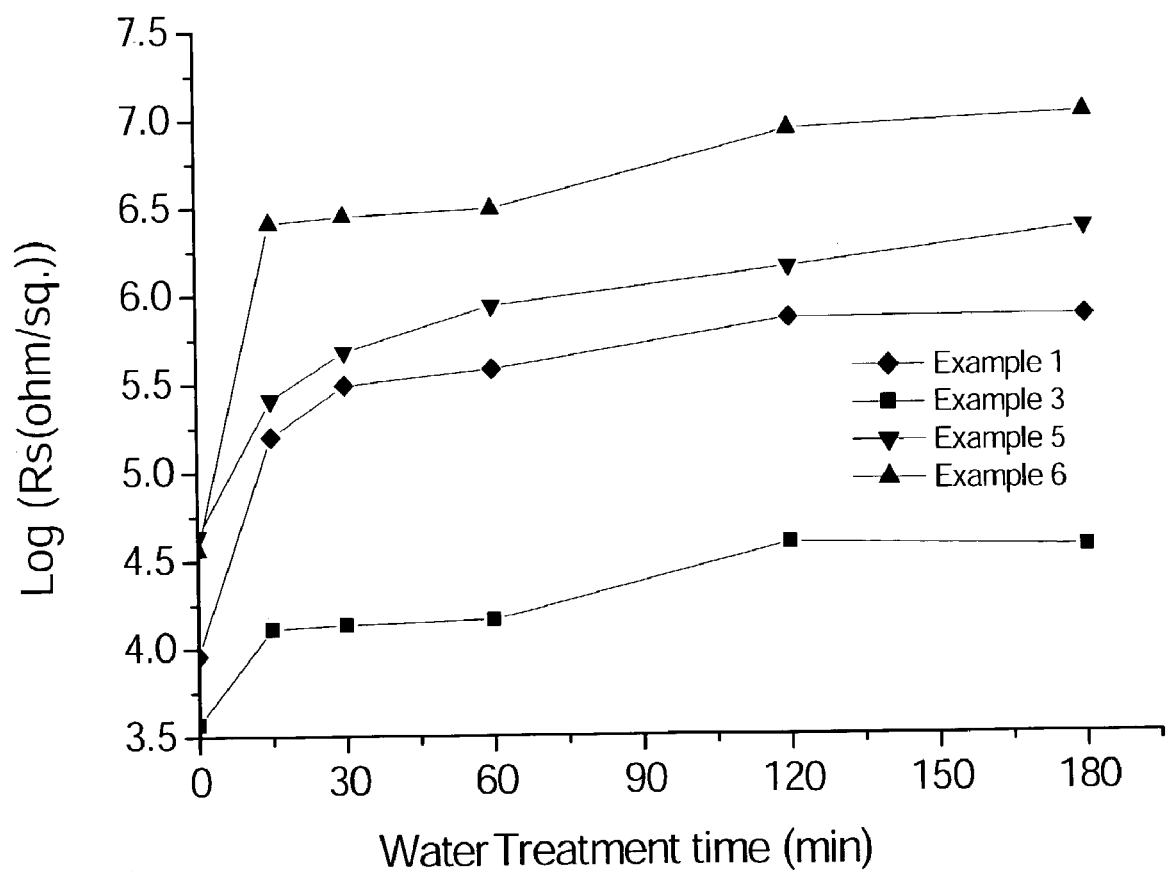
FIG. 1 displays the relationship between the sheet resistance and the water treatment time for a doped polyaniline coating coated with a fluorinated ethylene propylene copolymer (Example 1), a doped polyaniline free-standing film coated with a fluorinated ethylene propylene (Example 3), a polyaniline-viologen thin film assembly coated with a fluorinated ethylene propylene after UV irradiation (Example 5) and a polyaniline-viologen thin film assembly irradiated with UV after coating with a fluorinated ethylene propylene (Example 6), when immersed in water.

The electroactive polymer can be selected, for example, from polyanilines [PANI], polypyrroles, polythiophenes, polyacetylenes [(CH)x], poly(para-phenylene)[PPP] and poly(p-phenylene vinylene)[PPV]. The electroactive polymers can be either unsubstituted or substituted. Examples of substituted polyanilines include, for example, poly(o-toluidine), and halogenated polyanilines such as poly(2-fluoroaniline), poly(o-chloroaniline), and the like. Polyaniline is commercially available. Examples of substituted polypyrroles include, for example, N-substituted pyrroles such as 1-(carboxyalkyl) pyrroles and 1-(4-nitrophenyl) pyrrole, and the like. Examples of substituted polythiophenes include, for example, poly(3,4-ethylenedioxythiophene), poly[3-(4-octylphenyl)thiophene], and the like.

The unsubstituted or substituted electroactive polymers can also contain large organic or polymeric anions as dopants, for example as described by Neoh et al. in *Polym. Degrad. Stabil.* 43, 141 (1994), or they can be self-doped polymers, for example as described by Yue et al. in *J. Am. Chem. Soc.* 113, 2665(1991), by Kang et al in *Polym. Commun.* 32, 412 (1991), or by Murata et al. in *Synth. Met.* 96, 161 (1998).

An electroactive polymer may be in any form, for example in the form of a free-standing film, a thin film coating on inert substrates such as LDPE (low density polyethylene) film, or a coating on viologen-grafted LDPE films. One method of preparing the electroactive polymer on a substrate involves placing the substrate in a polymerizing mixture of the appropriate monomer to obtain a thin film coating of the electroactive polymer. Other preferred methods for preparing electroactive polymers involve casting the electroactive polymer from a solution into a thin film, or synthesizing the electroactive polymer in film form via electrochemical means (Tan, H. H.; Neoh, K. G.; Liu, F. T.; Kocherginsky, N.; Kang, E. T. *J. Appl. Polym. Sci.*, 80, 1, (2001); Cen, L.; Neoh, K. G.; Kang, E. T. *Langmuir*, 18, 8633, (2002)). The electroactive polymer can have: 1) only reduced repeating units (termed leucoemeraldine in the case of polyaniline), 2) only oxidized repeating units (termed pernigraniline in the case of polyaniline), or 3) varying ratios or both species (termed emeraldine in the case of polyaniline with a 1:1 ratio of reduced and oxidized repeating units). The electroactive polymer can exist in the form of its base or its protonated form.

The redox active material can be selected, for example, from viologens such as described in European Patent No. 0 682 284 and U.S. Pat. No. 5,516,462, the relevant parts of which are hereby incorporated by reference. Mention is made of benzyl viologen and vinylbenzyl viologen and their salts, particularly the dihalide salts. Viologens have been studied extensively, and further examples of suitable viologens can be found in the literature (for example P. M. S. Monk, *The Viologens: Physicochemical Properties, Synthesis and Applications of the Salts of 4,4'-Bipyridine*, John Wiley & Sons, Chichester, 1998, which is hereby incorporated by reference). The redox active material may be in the form of a film or it can be immobilized on the surface of a substrate (Zhao, L. P.; Neoh, K. G.; Kang, E. T. *Chemistry of Materials*, 14, 1098,(2002); Liu, X.; Neoh, K. G.; Zhao, L. P.; Kang, E. T. *Langmuir*, 18, 2914, (2002)).

The invention also contemplates a composite or a material that comprises both an electroactive polymer and a redox active material. A composite that comprises both an electroactive polymer and a redox active material, such as a viologen, can exhibit interesting changes in conductivity under UV irradiation (Ng, S. W. ; Neoh, K. G.; Sampanthar, J. T. ; Kang, E. T.; Tan, K. L. *J. Phys. Chem. B*, 105, 5618, (2001)). Hence, irradiation of selected areas can provide conductivity to selected areas, and this has pertinence, for example, for pattern fabrication and electronic design. In some embodiments, the thin and transparent nature of the fluoropolymer coating is useful in these systems that comprise both an electroactive polymer and a redox active material, as the changes in conductivity obtained by UV irradiation can be carried out after the fluoropolymer coating is applied.

As fluoropolymer to be deposited, there is preferably used a perfluorinated polymer. Example of perfluorinated polymers include fluorinated ethylene propylene copolymers (FEP). Such copolymers are commercially available, for example, under the trademarks Hostaflon FEP and Teflon FEP. Examples also include polytetrafluoroethylene, which is commercially available, for example, under the trademarks Fluon, Hostaflon TF and Teflon TFE. These are commercially available from Goodfellow Cambridge Limited, and from other sources. Fluorinated ethylene propylene copolymers have excellent chemical resistance and good weathering resistance, along with good radiation resistance and impact strength. Though not quite crystal clear, the copolymer is transparent (from about 250/300 nm to about 7000 nm) and it is colorless or has a slight bluish tinge.

In the present invention, a layer of fluoropolymer is sputtered on the surface of an electroactive polymer or redox active material. One sputtering method involves the placement of the fluoropolymer as a target in a radio frequency (RF) magnetron sputter gun powered by a RF generator in a sputtering chamber. A sample to be coated (i.e. electroactive polymer or redox active material) is fixed on a rotary sample stage placed at a suitable distance away from the target. The RF sputtering is carried out in a reduced pressure environment, for example at a pressure of 12 mTorr, and a sputtering gas, for example argon, is introduced into the chamber to form the plasma for bombarding the target [Zhang Yan, Yang G. H., Kang, E. T. and Neoh, K. G. Langmuir, 2002, 18, 6373]. For a specific fluoropolymer, the thickness of the fluoropolymer layer is mostly dependent on a) the distance between the electroactive material sample and the fluoropolymer target, b) the power of the radio frequency generator, and c) the length of sputtering time, and these conditions can be independently varied to obtain the wanted thickness of fluoropolymer. A suitable distance between the fluoropolymer target and the sample is about 13 cm, and the RF power can be in the range from 100 W to 300 W, for example 150 W, although other suitable distances or RF power values can be readily determined. For some applications, the sputtering time can be 100 seconds or more, preferably from 100 s to 600 s, to obtain the desired thickness of fluoropolymer coating. Normally, the distance between the fluoropolymer target and the sample to be coated is fixed for a specific RF magnetron sputtering instrument, therefore the thickness of the fluoropolymer coating is normally varied by changing the sputtering time and the RF power. The thickness of the fluoropolymer coating is also dependent on the nature of the fluoropolymer, as different fluoropolymers are deposited at different rates. A person skilled in the art will be able to determine which thickness of fluoropolymer is suitable for enhancing the stability of the electroactive polymer or the redox active material. For some purposes, a sputtered fluoropolymer layer thickness from about 10 nm to about 100 nm or more is preferred, and a thickness from about 10 to about 50 nm is more preferred.

In one embodiment, with a fluorinated ethylene propylene copolymer (FEP) target, with a target and sample (i.e., electroactive polymer or redox active material) separation of 13 cm and with a RF power of 150 W, the thickness of the FEP deposited on the sample can be varied from less than 10 nm for a 100 seconds sputtering time, 16 nm for 300 seconds, and 43 nm for 600 seconds.

A preferred application and good results are obtained when the fluoropolymer layer is transparent and of thickness in the nanometer scale. Such a coating is adherent and allows further photo-induced reaction in the active materials to be carried out after the coating process. The sputtering technique can be applied to fluoropolymers in general. After the completion of the sputtering process, the stability of the electroactive polymer or redox active material is enhanced without further processing. The thickness of the sputtered fluoropolymer coating can be determined by using, for example, a surface profiling instrument such as an Alpha-STEP 500 Surface Profiler (KLA-Tencor Co. San Jose, Calif., USA).

Applications

The present invention may further extend the applications of electroactive polymers and redox active materials such as polyaniline. The sputtered fluoropolymer coating may work as a barrier to prevent the degradation of conducting polymers when they are used as coatings in aqueous environments. This technology may also be employed in electrochemical devices. In addition, this invention may also find applications in maintaining the electrical stability of conducting polymer patterns formed on semiconductors in oxidative or basic atmospheres, using the sputtered fluoropolymer as the passivation layer. In the area of optical and radiation technology, the use of sputtered fluoropolymer to prolong the photochromic effect may have potential applications in electrochromic displays, smart windows, dosimeters and actinometers.

EXAMPLES

The following specific examples are provided to illustrate this invention and the manner in which it may be carried out. It will be understood, however, that the specific details given in each example have been selected for the purpose of illustration, and are not to be construed as being limitations on the scope of the invention.

In all the examples there was used a magnetron with a RF power of 150 W and distance between a fluoropolymer target and a sample to be coated of about 13 cm.

In the examples, the fluorinated ethylene propylene copolymer used is as obtained from Goodfellow Cambridge Limited, under the trademarks Teflon FEP or Hostaflon FEP, and the polytetrafluoroethylene used is as obtained under the trademarks Fluon, Teflon TFE or Hostaflon TF.

Example 1

A coating of polyaniline (in the emeraldine state) on a low-density polyethylene (LDPE) substrate was prepared according to a previous report (Ng S. W. , Neoh K. G., Sampanthar J. T. , Kang E. T., Tan K. L. J. Phys. Chem. B, 105, 5618(2001), the disclosure of which is hereby incorporated by reference).

Before the sputtering process, the polyaniline coated LDPE film was redoped to the conducting state (sheet resistance~$2.4\times10^3\Omega$/sq) by treatment with 0.5M $H_2SO_4$. This film was then sputtered with fluorinated ethylene propylene copolymer (FEP) for 100 s using argon, to deposit FEP copolymer on the polyaniline coated LDPE film. A fluoropolymer coating of about 10 nm was obtained.

When the film with the FEP layer was immersed in water, the sheet resistance (Rs) was initially $9\times10^3\Omega$/sq, and it increased to $7.4\times10^5\Omega$/sq after 3 hours. The change in Rs with time of treatment in water is shown in FIG. 1. In comparison, the sheet resistance of a similar polyaniline film without FEP coating would increase to more than $6.6\times10^9$ $\Omega$/sq after only 5 min immersion in water.

Figure 2:
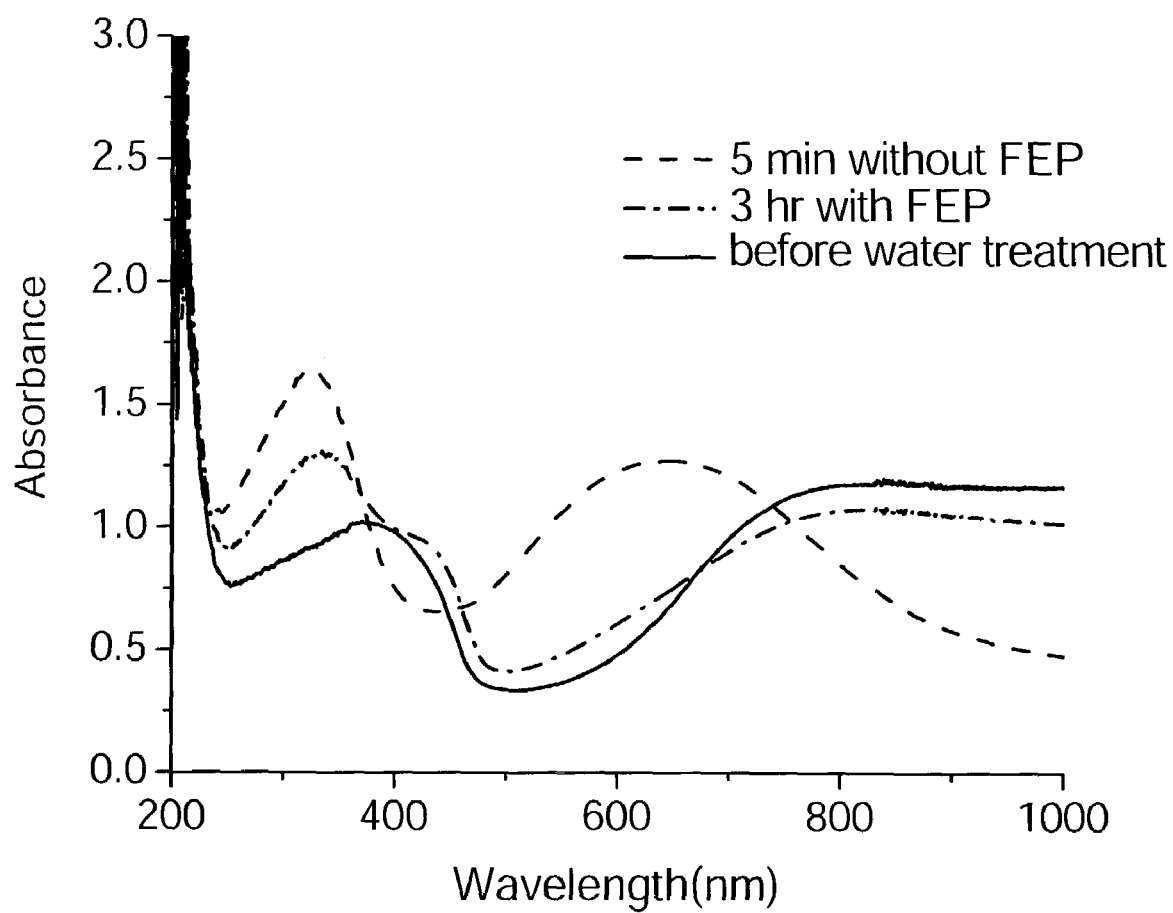
FIG. 2 displays a UV-visible absorption spectrum of a non-treated polyaniline coating before immersion in water, of a non-treated polyaniline coating after a 5 minute immersion in water, and of a treated (fluorinated ethylene propylene copolymer coating) polyaniline coating after a 3 hour immersion in water.

The UV-visible absorption spectrum of polyaniline is indicative of its doped state. In FIG. 2, the UV-visible absorption spectra of the polyaniline films with and without the FEP coating after immersion in water are compared with that of doped polyaniline before treatment with water. In the spectrum of the doped PANI film before water treatment, there is no absorption band at around 620 nm, while a band at 430 nm and a high absorption tail beyond 800 nm exist. These two bands have been assigned to excitations from the highest and second highest occupied energy bands to the partially filled polaron band in PANI, indicating the polymer is in its conductive state. In the case of the film with FEP coating after 3 h immersion in water, the spectrum is similar to that of the doped polyaniline prior to treatment with water.

Without a FEP coating, the doped PANI film undopes very quickly upon exposure to water. The intensity of the 620 nm band increases while the bands at 430 nm and beyond 800 nm decrease, implying a conversion of the electroactive polymer to the non-conductive (undoped) state. The absorption peaks found at 325 and 625 nm after 5 minutes immersion in water are characteristic of undoped polyaniline (emeraldine base). Thus the UV-visible absorption spectroscopy results are consistent with the sheet resistance measurements which show that with the FEP coating the polyaniline remains in the conductive state even after 3 h in water.

Example 2

A polyaniline coated LDPE film was synthesized as described in Example 1. The film was then sputtered with a fluorinated ethylene propylene copolymer (FEP) for 600 s under an argon atmosphere. The film with the FEP layer was then immersed in 0.01 M NaOH. Sheet resistance increased gradually from an initial value of $5.06\times10^4 \Omega/sq$ to a value of $6.5\times10^6 \Omega/sq$ after 3 hours. On the other hand, the polyaniline film without FEP coating was undoped immediately after immersion in 0.01 M NaOH solution and was changed to an insulating state.

Example 3

A polyaniline free-standing base film (in the emeraldine or 50% oxidation state) was synthesized via the oxidative polymerization of aniline using ammonium persulfate in 0.5M $H_2SO_4$ (MacDiarmid A. G. et al. *Synth. Met.* 18, 285 (1987), the disclosure of which is hereby incorporated by reference), in accordance with the following procedure. Polyaniline powder was undoped using excess 0.5 M NaOH and the polyaniline (emeraldine) base powder was dissolved in N-methyl pyrrolidinone (NMP), to give a solution of 8 wt %. A free-standing film of 10-20 µm thickness was cast from the polyaniline base in the NMP solution. The polyaniline free-standing film was then doped by treatment with 0.5M $H_2SO_4$ and dried under reduced pressure. The film was then sputtered with fluorinated ethylene propylene copolymer (FEP) for 100 s under an argon atmosphere to obtain a fluoropolymer coating of about 10 nm. The film with the FEP layer was immersed in water. Sheet resistance (Rs) increased slowly from an initial value of $3.7\times10^3 \Omega/sq$ to a value of $3.6\times10^4 \Omega/sq$ after 3 hours. The change in Rs with the time of treatment in water is shown in FIG. 1. In contrast, the sheet resistance of the doped free-standing PANI film without FEP coating increased from $1.2\times10^3 \Omega/sq$ to $3.3\times10^5 \Omega/sq$ after 3 h.

Example 4

A polyaniline coated LDPE film was synthesized as described in Example 1. The film was then sputtered with polytetrafluoroethylene (PTFE) for 100 s under an argon atmosphere. The film with the PTFE layer was immersed in water. Sheet resistance increased from $8.5\times10^4$ to $4.2\times10^6$ $\Omega/sq$ after the first 15 min, and then slowly increased to more than $6.6\times10^9 \Omega/sq$ after 2 hours. While the PTFE coating offers a degree of protection to the polyaniline from the aqueous environment, it is not as effective as a FEP coating formed under the same sputtering conditions (RF power and sputtering time) possibly due to a lower deposition rate of the PTFE polymer.

Example 5

A polyaniline-benzyl viologen chloride thin film assembly on LDPE was synthesized according to a previously published method. (Zhao Luping, Neoh K. G., Kang E. T., *Chem. Mater.* 14, 1098(2002), the disclosure of which is hereby incorporated by reference). The polyaniline-viologen film was converted to a conductive state via exposure to near UV-irradiation from a 1 kW mercury lamp for 1 h [please refer to (Ng, S. W. ; Neoh, K. G.; Sampanthar, J. T. ; Kang, E. T.; Tan, K. L. *J. Phys. Chem. B*, 105, 5618, (2001))]. It was then sputtered with fluorinated ethylene propylene copolymer (FEP) for 100 s, using argon, to obtain a fluoropolymer coating of about 10 nm. The film with the nanostructured FEP layer was immersed in water. Sheet resistance (Rs) increased slowly from an initial value of $4.4\times10^4 \Omega/sq$ to a value of $2.3\times10^6 \Omega/sq$ after 3 hours. The change in Rs with time of treatment in water is shown in FIG. 1. In comparison, the sheet resistance of a similar polyaniline-viologen film without FEP coating would increase to more than $6.6\times10^9 \Omega/sq$ after only 5 min immersion in water.

Example 6

A polyaniline-benzyl viologen chloride film assembly was synthesized as described in Example 5. Before exposure to UV irradiation, the film was sputtered with fluorinated ethylene propylene copolymer (FEP) for 100 s, using argon. The film was then exposed to near UV-irradiation emitted from a 1 kW mercury lamp for 1 h to render the film electrically conductive. The film was immersed in water and its sheet resistance (Rs) was observed to increase slowly from an initial value of $3.6\times10^4 \Omega/sq$ to a value of $1.1\times10^7$ $\Omega/sq$ after 3 hours. The change in Rs with time of treatment in water is shown in FIG. 1. In comparison, the sheet resistance of a similar polyaniline-viologen film without FEP coating increases to more than $6.6\times10^9 \Omega/sq$ after only 5 minutes of immersion in water.

Example 7

Figure 3:
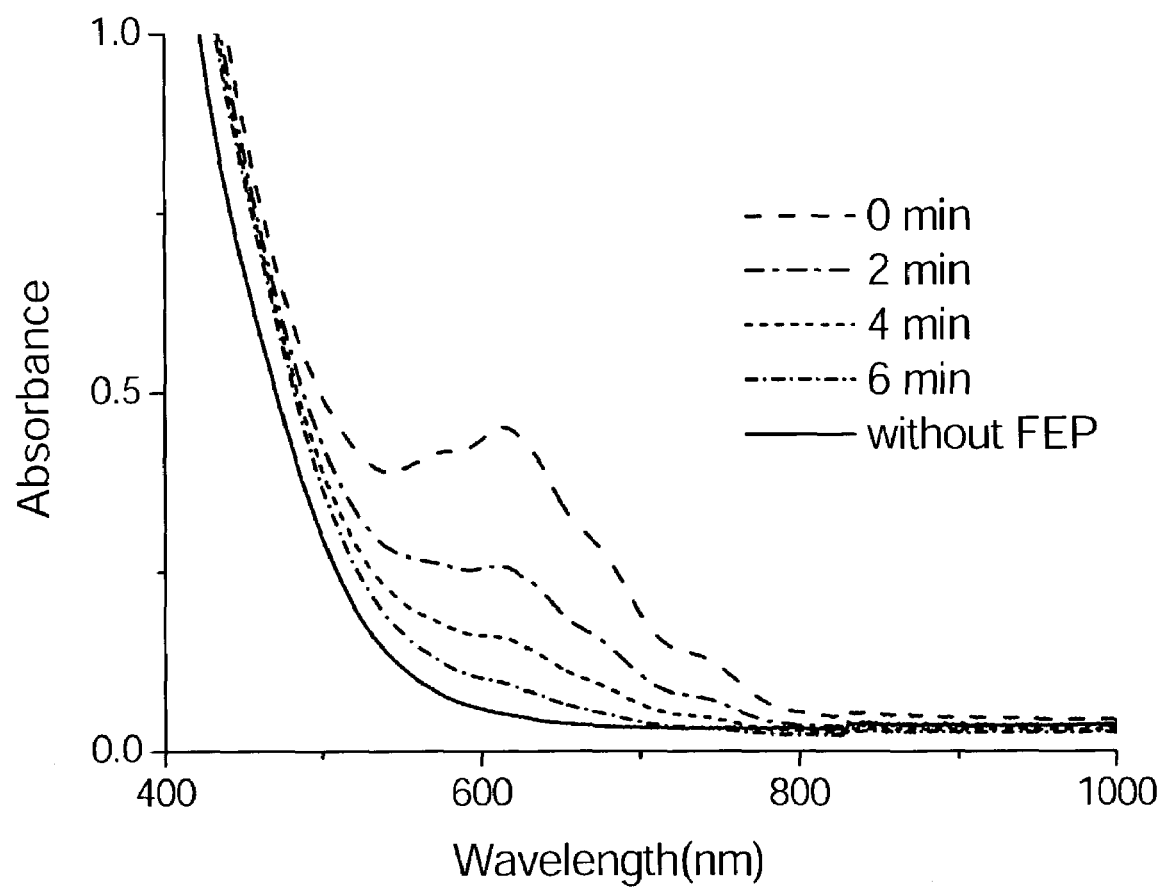
FIG. 3 displays a UV absorption spectrum of a non-fluoropolymer coated vinyl benzyl viologen grafted film, in the presence of oxygen, 1 minute after the formation of the viologen radical cation, and a sequence of UV absorption spectra of a fluoropolymer coated vinyl benzyl viologen grafted film, in the presence of oxygen, 0, 2, 4, and 6 minutes after the formation of the viologen radical cation.

Vinylbenzyl viologen dichloride grafted on a LDPE film was synthesized according to a previously published method. (Liu Xin, Neoh K. G., Zhao Luping, and Kang E. T., *Langmuir*, 18, 2914 (2002), the disclosure of which is hereby incorporated by reference). This viologen-grafted film was sputtered with fluorinated ethylene propylene copolymer (FEP) for 100 s, using argon, to obtain a fluoropolymer coating of about 10 nm. The FEP coated viologen film was then exposed to near UV-irradiation for 10 min in order to form viologen radical cations. The formation of the viologen radical cations resulted in a blue coloration, and UV-visible adsorption spectroscopy showed an absorption band at about 613 nm. Upon termination of the irradiation, with oxygen present, the viologen radical cations rapidly react with oxygen to return to the dication state and the color bleaches. In the absence of the FEP coating, the blue coloration is lost within 1 minute. With the FEP coating, availability of oxygen is restricted and the bleaching process is thus retarded as shown in FIG. 3.

To those skilled in the art to which this invention relates, many changes in construction and widely different embodiments and applications of the invention will suggest themselves without departing from the spirit and scope of the invention. The disclosures and description therein are purely illustrative and are not intended to be in any sense limiting.

The documents cited and referred to above are hereby incorporated by reference.

We claim:

1. A redox active material, or a composite comprising an electroactive polymer and a redox active material, that bears a coating having a thickness of from about 10 nm to about 40 nm, the coating consisting of a radio frequency sputtered fluoropolymer.

2. A method for preparing a redox active material or a composite comprising an electroactive polymer and a redox active material, according to claim 1, which method comprises depositing on the redox active material, or the composite, a fluoropolymer coating by radio frequency sputtering, the fluoropolymer coating having a thickness of about 10 nm to about 40 nm.

3. A method according to claim 2, wherein the electroactive polymer is selected from the group consisting of unsubstituted or substituted polyaniline, polypyrrole, polythiophene, polyacetylene, poly(para-phenylene), poly(p-phenylene vinylene), and their derivatives.

4. A method according to claim 2, wherein the electroactive polymer is unsubstituted or substituted polyaniline.

5. A method according to claim 2, wherein the redox active material is a viologen.

6. A method according to claim 2, wherein the redox active material is selected from the group consisting of benzyl viologen and vinyl benzyl viologen.

7. A method according to claim 2, wherein the fluoropolymer is a perfluorinated polymer.

8. A method according to claim 2, wherein the fluoropolymer is a fluorinated ethylene propylene copolymer.

9. A method according to claim 2, wherein the fluoropolymer is polytetrafluoroethylene.

10. A method according to claim 2, wherein the composite comprising an electroactive polymer and a redox active material, is subjected to UV irradiation to render it electrically conductive before deposition of the fluoropolymer.

11. A method according to claim 2, wherein the composite comprising an electroactive polymer and a redox active material, is subjected to UV irradiation to render it electrically conductive after deposition of the fluoropolymer.

12. A method according to claim 2, wherein the radiofrequency sputtering is carried out with a distance of about 13 cm between a fluoropolymer target and the redox active material or composite, with a radio frequency power of from about 100 W to about 300 W, and for a time of from about 100 seconds to about 600 seconds.

13. A redox active material according to claim 1 that displays oxidation resistance when contacted with an oxidative atmosphere.

14. A composite according to claim 1 that displays electrical stability when immersed in an aqueous medium.

15. A composite according to claim 1, wherein the electroactive polymer is selected from the group consisting of unsubstituted or substituted polyaniline, polypyrrole, polythiophene, polyacetylene, poly(para-phenylene), poly(p-phenylene vinylene), and their derivatives.

16. A composite according to claim 1, wherein the electroactive polymer is unsubstituted or substituted polyaniline.

17. A redox active material or composite according to claim 1, wherein the redox active material is a viologen.

18. A redox active material or composite according to claim 1, wherein the redox active material is selected from the group consisting of benzyl viologen and vinyl benzyl viologen.

19. A redox active material or composite according to claim 1, wherein the fluoropolymer is a perfluorinated polymer.

20. A redox active material or composite according to claim 1, wherein the fluoropolymer is a fluorinated ethylene propylene copolymer.

21. A redox active material or composite according to claim 1, wherein the fluoropolymer is polytetrafluoroethylene.

* * * * *